United States Patent
Lee et al.

(10) Patent No.: US 11,538,701 B2
(45) Date of Patent: Dec. 27, 2022

(54) METHOD OF INSPECTING A SEMICONDUCTOR PROCESSING CHAMBER USING A VISION SENSOR, AND METHOD FOR MANUFACTURING A SEMICONDUCTOR DEVICE USING THE SAME

(71) Applicant: SAMSUNG ELECTRONICS CO., LTD., Suwon-si (KR)

(72) Inventors: Taehyoung Lee, Suwon-si (KR); Byeongsang Kim, Hwaseong-si (KR); Sung Chai Kim, Yongin-si (KR); Wooram Kim, Incheon (KR); Kyungwon Yun, Hwaseong-si (KR); Keonho Lee, Hwaseong-si (KR); Sangil Im, Suwon-si (KR); Namyoung Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 365 days.

(21) Appl. No.: 16/791,564

(22) Filed: Feb. 14, 2020

(65) Prior Publication Data
US 2021/0013074 A1    Jan. 14, 2021

(30) Foreign Application Priority Data
Jul. 8, 2019    (KR) .......................... 10-2019-0082294

(51) Int. Cl.
*H01L 21/67*    (2006.01)
*G05B 19/406*    (2006.01)
(Continued)

(52) U.S. Cl.
CPC ... *H01L 21/67276* (2013.01); *G01N 21/8851* (2013.01); *G01N 21/954* (2013.01);
(Continued)

(58) Field of Classification Search
CPC ......... H01L 21/67276; H01L 21/67242; H01L 22/12; H01L 22/24; H01L 22/30; G01N 21/8851; G01N 21/954; G01N 2201/06113; G01N 2201/10; G01N 21/95; G05B 19/406; G05B 2219/45031; G06T 7/0004;
(Continued)

(56) References Cited

U.S. PATENT DOCUMENTS 6,807,503 B2    10/2004    Ye et al.
7,127,362 B2    10/2006    Mundt
(Continued)

*Primary Examiner* — Richard A Hansell, Jr.
(74) *Attorney, Agent, or Firm* — Sughrue Mion, PLLC

(57) ABSTRACT

A method of inspecting a semiconductor processing chamber includes providing a vision sensor into the semiconductor processing chamber, aligning the vision sensor on a target in the semiconductor processing chamber, obtaining an object image of the target using an image scanning module of the vision sensor, generating a three dimensional model of the target based on the object image, and obtaining a physical quantity of the target from the three dimensional model. The obtaining of the object image of the target includes projecting a pattern onto the target using an illuminator of the image scanning module, and scanning an image of the target in which the pattern is projected, using a camera of the image scanning module.

22 Claims, 17 Drawing Sheets

(51) Int. Cl.
    *G06T 7/00*     (2017.01)
    *G01N 21/88*    (2006.01)
    *G01N 21/954*   (2006.01)
(52) U.S. Cl.
    CPC .......... *G05B 19/406* (2013.01); *G06T 7/0004* (2013.01); *G01N 2201/06113* (2013.01); *G01N 2201/10* (2013.01); *G05B 2219/45031* (2013.01); *G06T 2207/30148* (2013.01)
(58) Field of Classification Search
    CPC ...... G06T 2207/30148; G01B 11/0608; G01B 11/25
    See application file for complete search history.

(56) References Cited

U.S. PATENT DOCUMENTS

| | | | |
|---|---|---|---|
| 7,233,841 B2 | 6/2007 | Sadighi et al. | |
| 7,283,255 B2* | 10/2007 | Ramsey | H01L 21/67259 356/614 |
| 7,855,549 B2* | 12/2010 | Renken | H01L 21/67253 324/750.3 |
| 8,158,526 B2 | 4/2012 | Grimbergen | |
| 8,726,837 B2 | 5/2014 | Patalay et al. | |
| 8,970,693 B1* | 3/2015 | Chang | G06T 7/521 348/136 |
| 10,229,818 B2 | 3/2019 | Vladimir et al. | |
| 10,509,052 B2* | 12/2019 | Thaulad | G01P 15/18 |
| 10,748,798 B1* | 8/2020 | Tsai | H04N 5/2226 |
| 2003/0039388 A1* | 2/2003 | Ulrich | G01B 11/2518 382/145 |
| 2008/0050847 A1 | 2/2008 | Gluschenkov et al. | |
| 2016/0335492 A1* | 11/2016 | Chern | G06V 20/653 |
| 2018/0261481 A1 | 9/2018 | Eto | |
| 2019/0108396 A1* | 4/2019 | Dal Mutto | G06V 20/52 |
| 2020/0073531 A1* | 3/2020 | Romano | G02B 27/0172 |

* cited by examiner

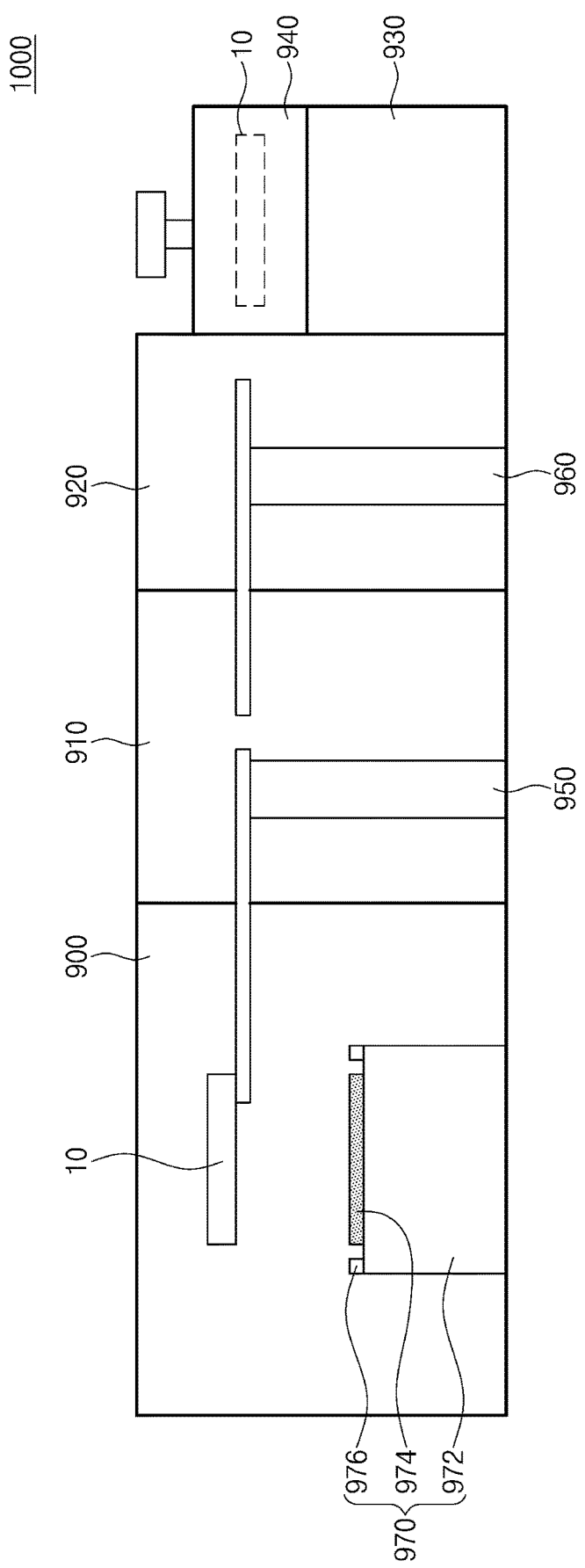

METHOD OF INSPECTING A SEMICONDUCTOR PROCESSING CHAMBER USING A VISION SENSOR, AND METHOD FOR MANUFACTURING A SEMICONDUCTOR DEVICE USING THE SAME

CROSS-REFERENCE TO RELATED APPLICATION

This application claims priority under 35 U.S.C. § 119 to Korean Patent Application No. 10-2019-0082294 filed on Jul. 8, 2019, in the Korean Intellectual Property Office, the disclosure of which is hereby incorporated by reference in its entirety.

BACKGROUND

1. Field

Example embodiments of the present disclosure relate to a vision sensor, a method of inspecting an internal structure of a semiconductor processing chamber using the same, and a method of manufacturing a semiconductor device using the same.

2. Description of the Related Art

Semiconductor devices are widely used in an electronic industry due to their small-sizes, multi-functions, and/or low manufacture costs. The semiconductor devices are manufactured by various manufacturing processes, such as a photolithography process, an etching process, an ion implantation process, and a cleaning process.

The manufacturing processes may be performed in a semiconductor processing chamber. During the performance of the manufacturing processes, states of parts within the semiconductor processing chamber may be changed. The state changes of the parts may affect process conditions of the manufacturing processes. Various inspection apparatuses and various inspection methods may precisely inspect minute state changes of the parts.

SUMMARY

According to example embodiments of the inventive concept, a vision sensor may include a support member, an image scanning module disposed on the support member and configured to obtain an object image of a target, the image scanning module including an illuminator configured to project a pattern onto the target, and a circuit member disposed on the support member. The circuit member may include a processor and a wireless communication module. The processor may be configured to receive the object image from the image scanning module and to generate data based on the object image. The wireless communication module may be configured to transmit the data to an external device.

According to example embodiments of the inventive concept, a method of inspecting a semiconductor processing chamber may include providing a vision sensor into the semiconductor processing chamber, aligning the vision sensor on a target in the semiconductor processing chamber, obtaining an object image of the target using an image scanning module of the vision sensor, generating a three dimensional model of the target based on the object image, and obtaining a physical quantity of the target from the three dimensional model. The obtaining of the object image of the target may include projecting a pattern onto the target using an illuminator of the image scanning module, and scanning an image of the target in which the pattern is projected, using a camera of the image scanning module.

According to example embodiments of the inventive concept, a method of manufacturing a semiconductor device may include providing a semiconductor substrate in a semiconductor processing chamber, performing a process for manufacturing a semiconductor device on the semiconductor substrate in the semiconductor processing chamber, transferring the semiconductor substrate out of the semiconductor processing chamber, and inspecting an internal structure of the semiconductor processing chamber by providing a vision sensor in the semiconductor processing chamber. The inspecting of the internal structure of the semiconductor processing chamber may include obtaining an object image of a target in the semiconductor processing chamber using an image scanning module of the vision sensor, and generating a three dimensional model of the target based on the object image. The obtaining of the object image of the target may include projecting a pattern onto the target using an illuminator of the image scanning module, and scanning an image of the target in which the pattern is projected, using a camera of the image scanning module.

According to example embodiments of the inventive concept, the vision sensor may include a support member including a plurality of holes, an image scanning module disposed on the support member and configured to obtain an object image of a target, the image scanning module including a camera configured to scan an image of the target and an illuminator configured to project a pattern onto the target, and a circuit member disposed on the support member, and including a processor and a wireless communication module. The processor may be configured to receive the object image from the image scanning module and to generate data based on the object image. The wireless communication module may be configured to transmit the data to an external device. The illuminator may include a laser light source and an optical member that controls an optical path of a laser light emitted from the laser light source. The laser light may be irradiated on the target through a corresponding hole among the plurality of holes. A lens of the camera may be overlapped with one of the plurality of holes.

BRIEF DESCRIPTION OF THE DRAWINGS

FIG. 15 is a schematic view illustrating a semiconductor processing apparatus including a semiconductor processing chamber according to example embodiments of the inventive concept.

DETAILED DESCRIPTION OF THE EMBODIMENTS

Various example embodiments will now be described more fully with reference to the accompanying drawings in which some example embodiments are shown. However, the inventive concept may be embodied in many alternate forms and should not be construed as limited to only example embodiments set forth herein.

Figure 1:
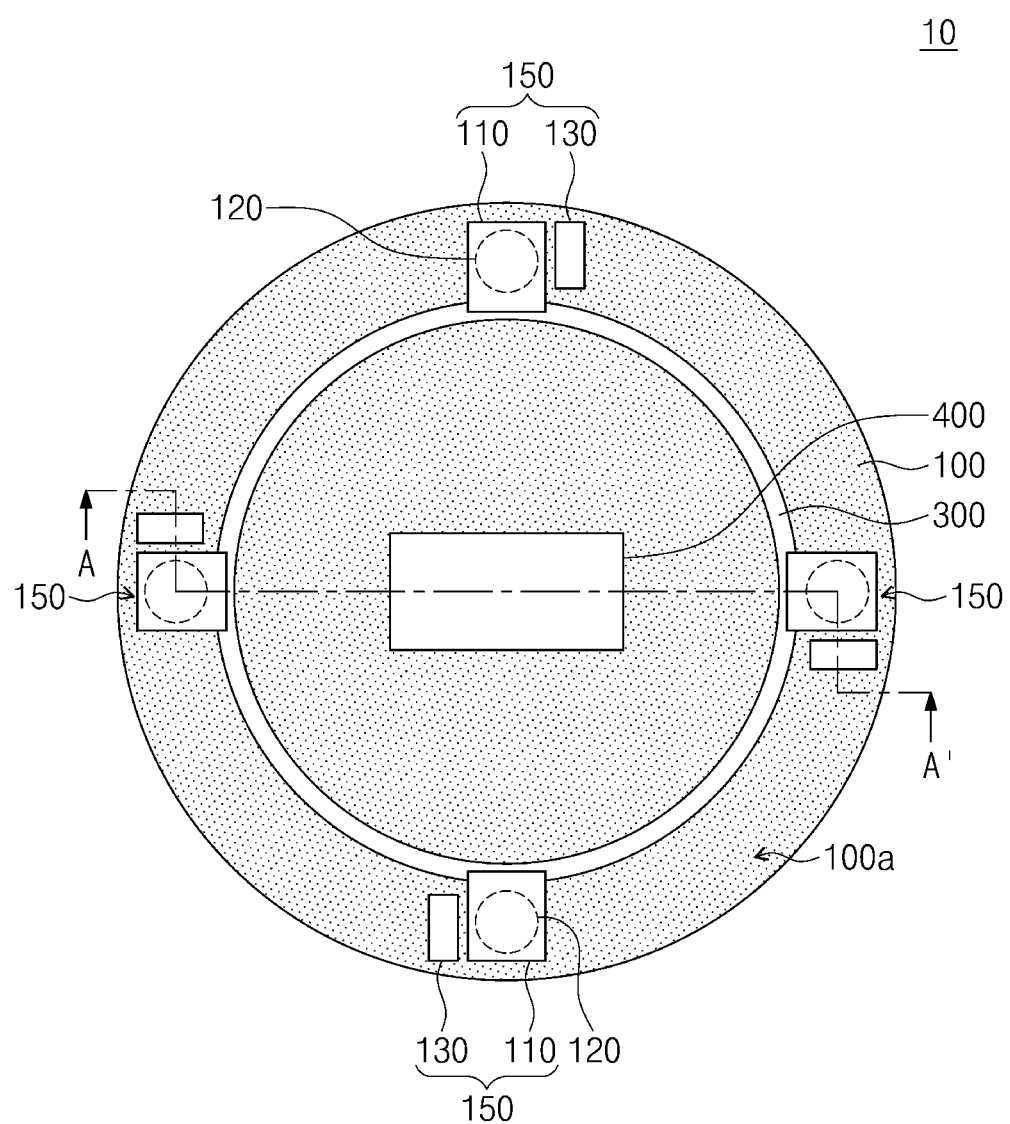
FIG. 1 is a front view of a vision sensor according to example embodiments of the inventive concept.
Figure 2:
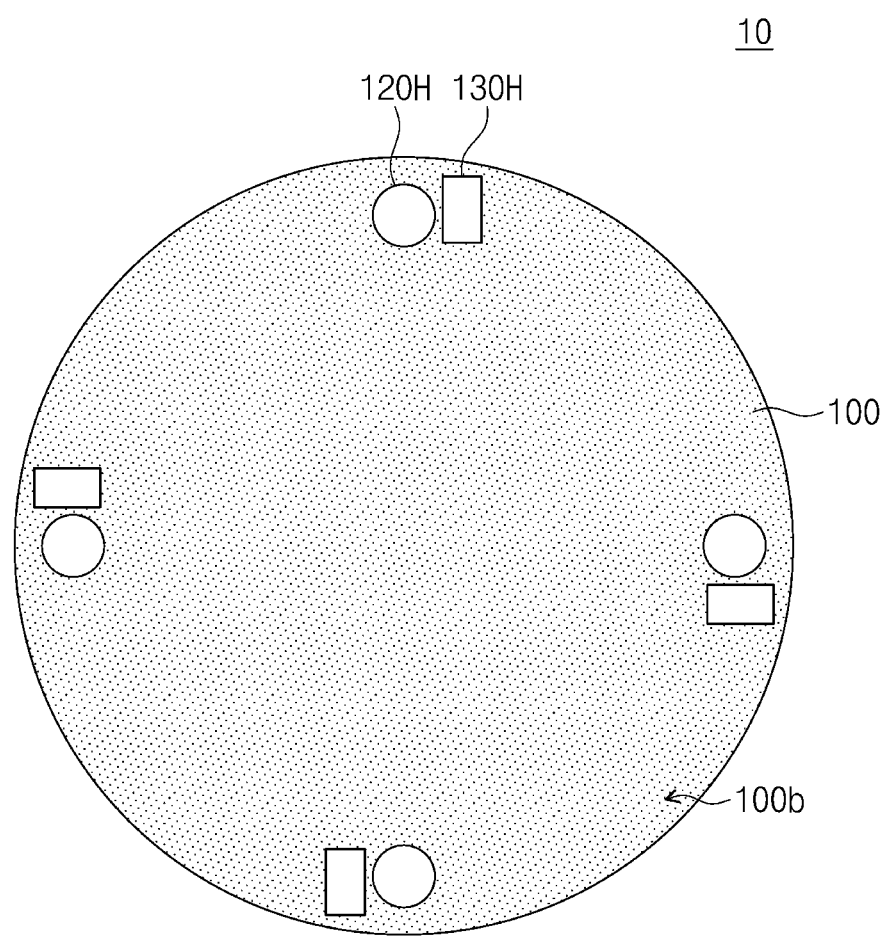
FIG. 2 is a rear view of a vision sensor according to example embodiments of the inventive concept.
Figure 3:
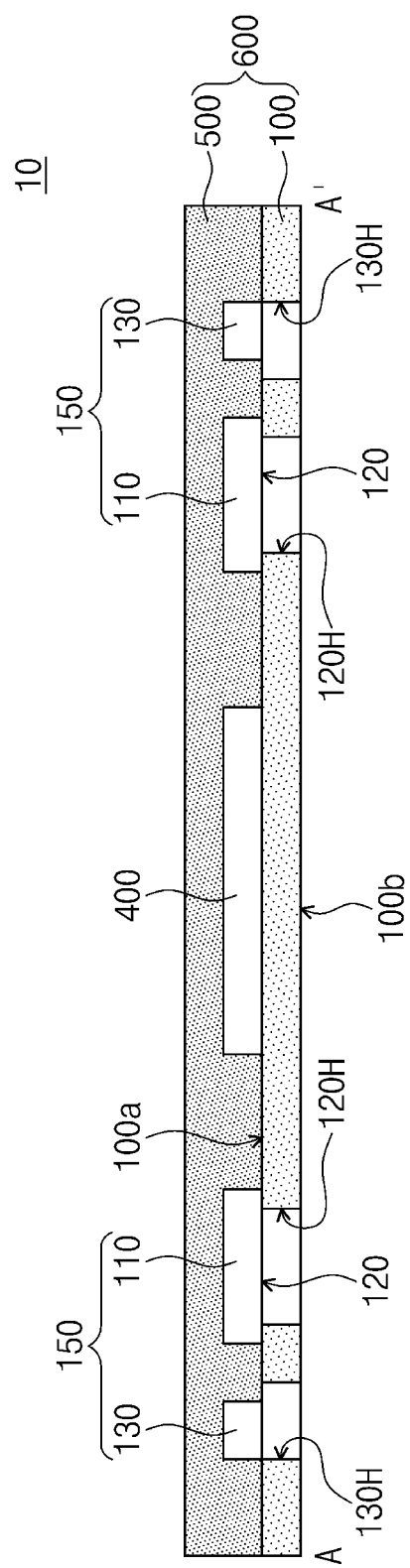
FIG. 3 is a cross-sectional view taken along line A-A' of FIG. 1.
Figure 4:
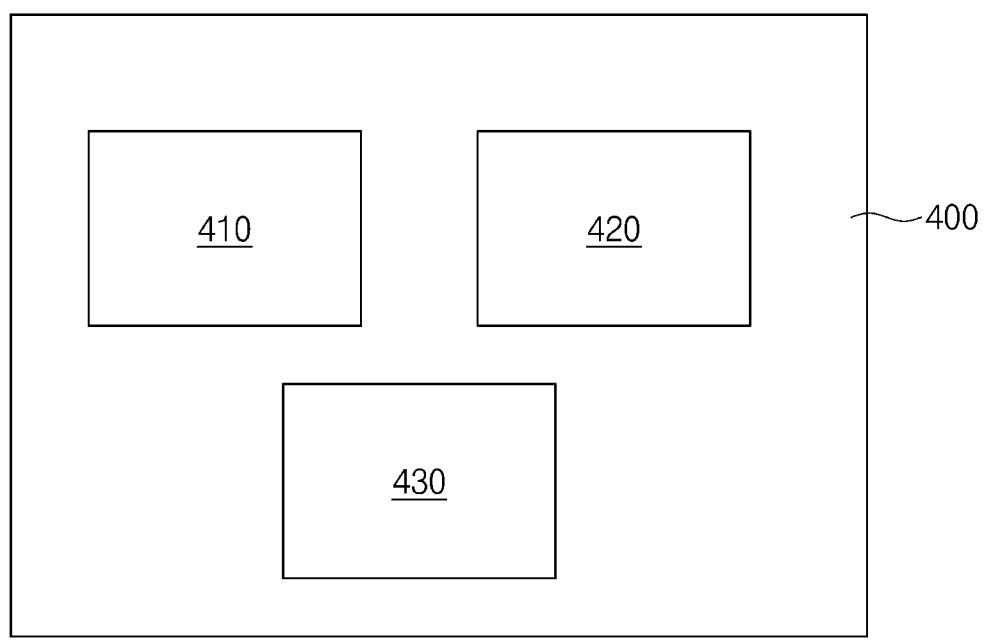
FIG. 4 is a conceptual view of a circuit member of FIG. 1.

FIG. 1 is a front view of a vision sensor according to example embodiments of the inventive concept. FIG. 2 is a rear view of a vision sensor according to example embodiments of the inventive concept. FIG. 3 is a cross-sectional view taken along line A-A' of FIG. 1. FIG. 4 is a conceptual view of a circuit member of FIG. 1.

Referring to FIGS. 1 to 3, a vision sensor 10 (hereinafter, referred to as a sensor) may include a support member 100. The support member 100 may have various shapes, such as a wafer shape, a cross shape, etc. In some embodiments, the support member 100 may have a wafer shape having substantially the same diameter as a semiconductor substrate used to form a semiconductor integrated circuit. For example, the support member 100 may have a wafer shape having a diameter of 200 mm or 300 mm, but the inventive concept is not limited thereto. The support member 100 may include a plurality of holes 120H and 130H passing therethrough. The support member 100 may have a first surface 100a and a second surface 100b that are opposite to each other. Each of the plurality of holes 120H and 130H may extend from the first surface 100a of the support member 100 to the second surface 100b of the support member 100.

The sensor 10 may include an image scanning module 150 disposed on the first surface 100a of the support member 100. The image scanning module 150 may be configured to obtain an object image of a target.

The image scanning module 150 may include a camera 110 and an illuminator 130. The illuminator 130 may be disposed on the support member 100 to be overlapped with a corresponding hole 130H among the plurality of holes 120H and 130H. The illuminator 130 may be configured to project a pattern (e.g., a fringe pattern) onto the target through the corresponding hole 130H. The camera 110 may be disposed on the support member 100, such that a lens 120 of the camera 110 may be overlapped with the corresponding hole 120H among the plurality of holes 120H and 130H. The camera 110 may be configured to scan an image of the target through the corresponding hole 120H.

In some embodiments, a plurality of image scanning modules 150 may be provided on the first surface 100a of the support member 100. The plurality of image scanning modules 150 may be arranged to be spaced apart from each other along an edge of the support member 100. A fixing member 300 may be disposed on the first surface 100a of the support member 100. The plurality of image scanning modules 150 may be coupled with the fixing member 300. The plurality of image scanning modules 150 may be fixed on the support member 100 by the fixing member 300, but the inventive concept is not limited thereto. In some embodiments, the fixing member 300 may be omitted. As shown in FIG. 1, four image scanning modules 150 may be arranged on the support member 100, but the inventive concept is not limited thereto. The number of the image scanning modules 150 disposed on the support member 100 may be variously modified.

Referring to FIGS. 1 and 4, the sensor 10 may include a circuit member 400 provided on the first surface 100a of the support member 100. The circuit member 400 may be disposed on a central portion of the support member 100, but the inventive concept is not limited thereto. The circuit member 400 may include a processor 410, a wireless communication module 420, and a battery module 430. The processor 410 may be configured to process various data. The wireless communication module 420 may be configured to transmit the various data processed by the processor 410 to an external device and to transmit various data provided from the external device to the processor 410. The battery module 430 may be configured to supply power to the sensor 10. The processor 410, the wireless communication module 420, and the battery module 430 may be coupled with each other through a data bus. The processor 410 may be configured to receive the object image of the target from the image scanning module 150 and to generate data based on the object image. The wireless communication module 420 may be configured to transmit the data generated by the processor 410 to the external device.

Referring to FIGS. 1 to 3, the sensor 10 may include a cover member 500 disposed on the first surface 100a of the support member 100. The cover member 500 may cover the first surface 100a of the support member 100, and may cover the image scanning module 150, the fixing member 300, and the circuit member 400. The support member 100 and the cover member 500 may constitute a housing 600, and may be provided within the housing 600. The housing 600 may have various shapes, such as a wafer shape or a cross shape, but the inventive concept is not limited thereto. In some embodiments, the housing 600 may have a wafer shape having substantially the same diameter as a semiconductor substrate used to form a semiconductor integrated circuit. For example, the housing 600 may have a wafer shape having a diameter of 200 mm or 300 mm, but the inventive concept is not limited thereto.

Figure 5:
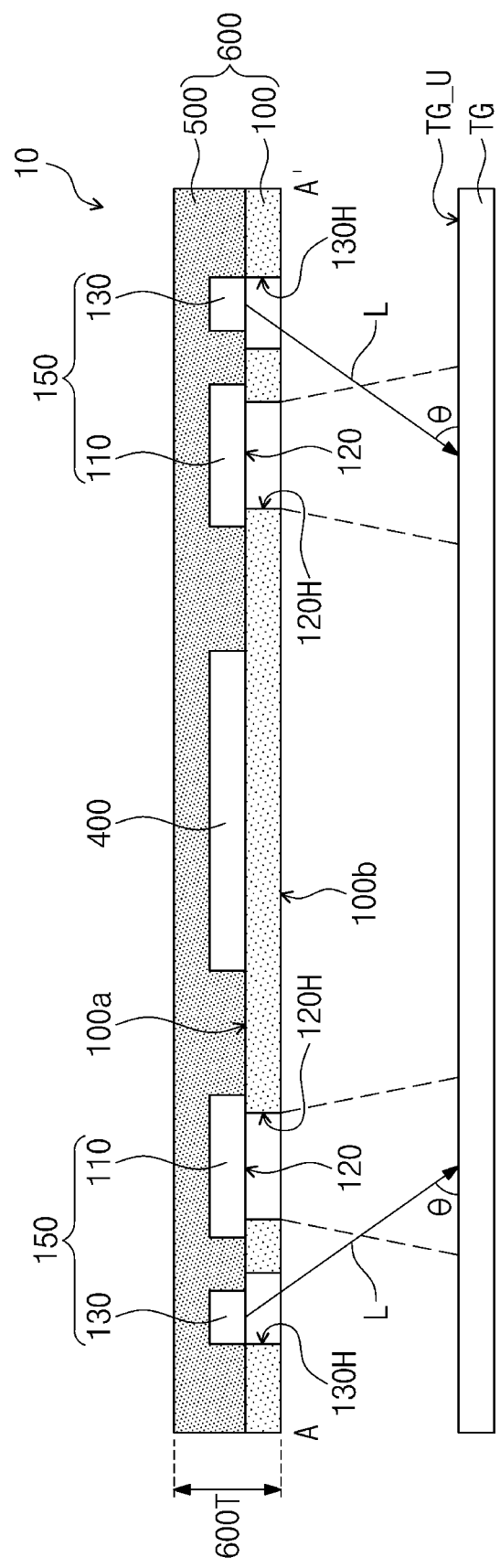
FIG. 5 is a conceptual view illustrating an operation of an image scanning module of a vision sensor according to example embodiments of the inventive concept.

FIG. 5 is a conceptual view illustrating an operation of an image scanning module of a vision sensor according to example embodiments of the inventive concept.

Referring to FIG. 5, the sensor 10 may be provided on a target TG. In some embodiments, the sensor 10 may be disposed so that the second surface 100b of the support member 100 faces the target TG. The illuminator 130 of the image scanning module 150 may irradiate light L onto the target TG through the corresponding hole 130H. The light L may be irradiated obliquely (or at an angle θ) to an upper surface TG_U of the target TG. The pattern (e.g., the fringe pattern) may be projected onto the target TG by the light L. The light L may be, for example, a laser light. The camera 110 of the image scanning module 150 may be configured to scan an image of the target TG in which the pattern (e.g., the fringe pattern) is projected. Thus, an object image of the target TG may be obtained by the image scanning module 150.

The object image obtained by the image scanning module 150 may be transmitted to the circuit member 400. For example, the processor 410 shown in FIG. 4 may be configured to receive the object image from the image scanning module 150 and to generate data based on the object image by processing the object image. The processor 410 may be configured to generate a two dimensional model of the target TG or a three dimensional model of the target TG based on the object image. For example, the processor 410 may be configured to generate a three dimensional model of the target TG based on the object image. The data generated by the processor 410 may be transmitted to the external device through the wireless communication module 420 shown in FIG. 4.

Figure 6:
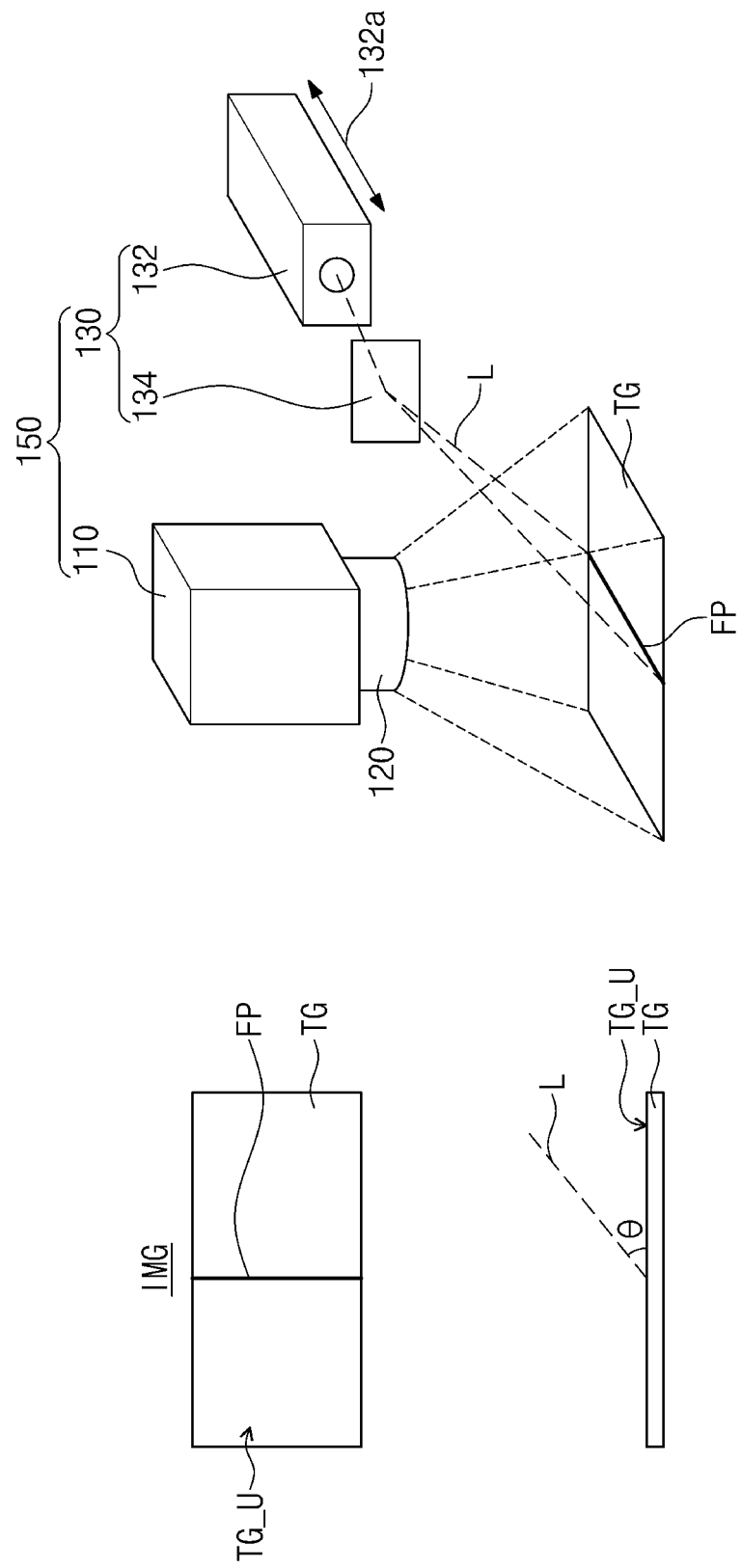
FIGS. 6 and 7 are conceptual views illustrating a method of generating a three dimensional model of a target based on an object image obtained by an image scanning module.
Figure 7:
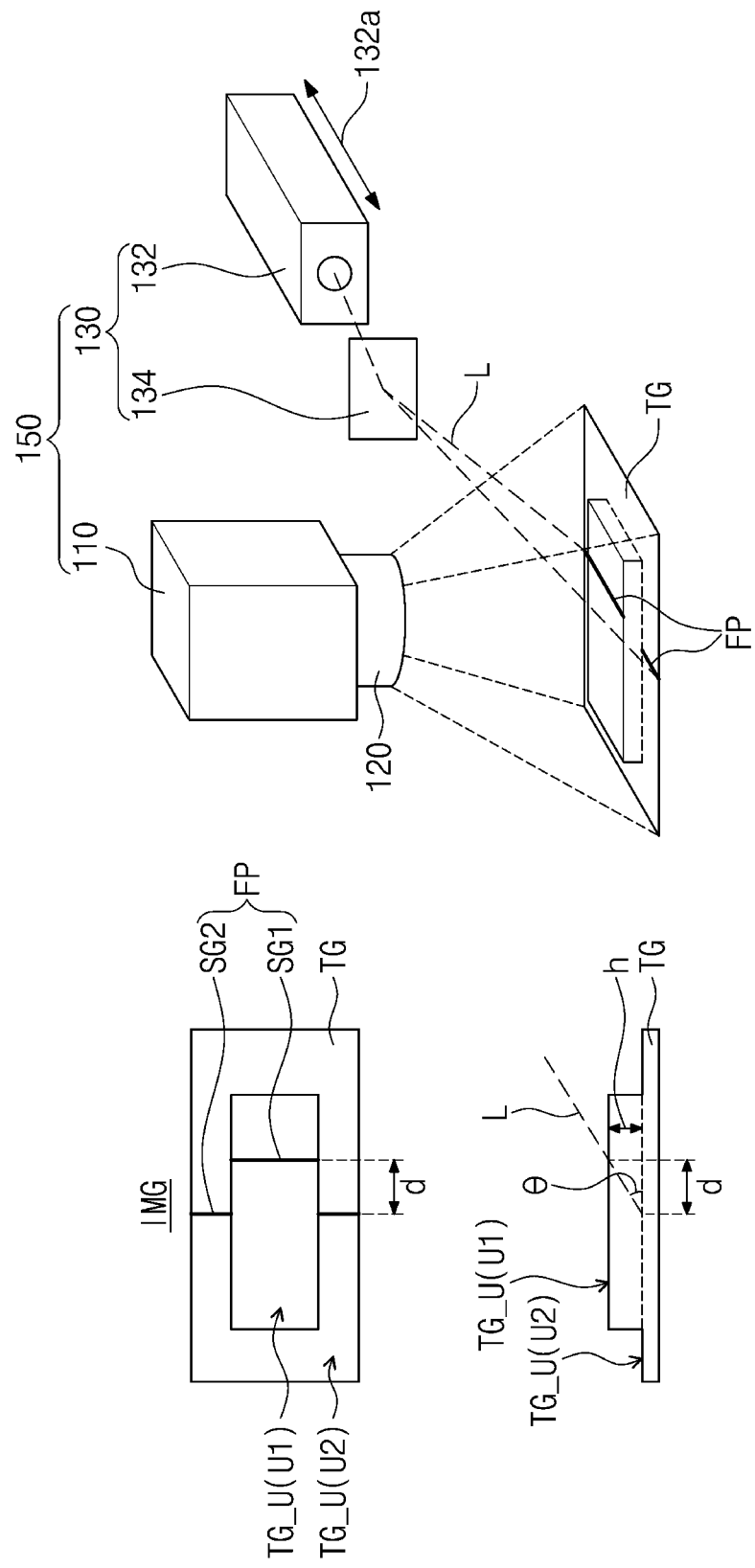

FIGS. 6 and 7 are conceptual views illustrating a method of generating a three dimensional model of a target based on an object image obtained by an image scanning module.

Referring to FIGS. 5, 6, and 7, the illuminator 130 of the image scanning module 150 may include a laser light source 132 and an optical member 134 controlling an optical path of the light (e.g., the laser light) L emitted from the laser light source 132. The laser light source 132 may be arranged so that its lengthwise axis 132a extends parallel to the first surface 100a of the support member 100. In this case, a thickness 600T of the housing 600 may be reduced. Here, the thickness 600T of the housing 600 may be a thickness along a vertical direction perpendicular to the first surface 100a of the support member 100. The thickness 600T of the housing 600 may be, for example, about 7 mm or less. The optical member 134 may be configured to adjust the optical path of the light L, such that the light L may be irradiated obliquely (or at an angle θ) to the upper surface TG_U of the target TG through the corresponding hole 130H. The pattern FP (e.g., the fringe pattern) may be projected onto the target TG by the light L. The camera 110 of the image scanning module 150 may be configured to scan an image of the target TG in which the pattern FP is projected, thus obtaining an object image IMG of the target TG. The pattern FP may be, for example, the fringe pattern having a linear shape. Thereafter, for convenience of explanation, the pattern FP will be exemplary explained as the fringe pattern having a linear shape, but the inventive concept is not limited thereto. The pattern FP may be the fringe pattern having various shapes.

In some embodiments, as shown in FIG. 6, the surface TG_U of the target TG may be flat. In this case, the pattern FP may be projected in a single linear shape onto the upper surface TG_U of the target TG. The object image IMG may include the fringe pattern FP of single linear shape.

In some embodiments, as shown in FIG. 7, the upper surface TG_U of the target TG may be uneven. For example, a portion U1 of the upper surface TG_U of the target TG may be at a higher level than the other portion U2 of the upper surface TG_U of the target TG. In this case, the pattern FP may be divided into a first segment SG1 projected onto the portion U1 of the upper surface TG_U of the target TG and a second segment SG2 projected onto the other portion U2 of the upper surface TG_U of the target TG. The object image IMG may include the fringe pattern FP divided into the first segment SG1 and the second segment SG2. In this case, a height difference h between the portion U1 of the upper surface TG_U of the target TG and the other portion U2 of the upper surface TG_U of the target TG may be obtained using a horizontal distance d between the first segment SG1 and the second segment SG2 and the angle θ of the light L relative to the upper surface TG_U of the target TG. The height difference h may be obtained by Equation (1) as follows:

$$h = d/(\tan \theta) \quad (1)$$

The processor 410 of FIG. 4 may be configured to generate a three model of the target TG by analyzing a shape of the pattern FP included in the object image IMG according to the method described above. The processor 410 may be configured to obtain a physical quantity (e.g., the height difference h of the upper surface TG_U of the target TG, etc.) from the three dimensional model of the target TG.

Figure 8:
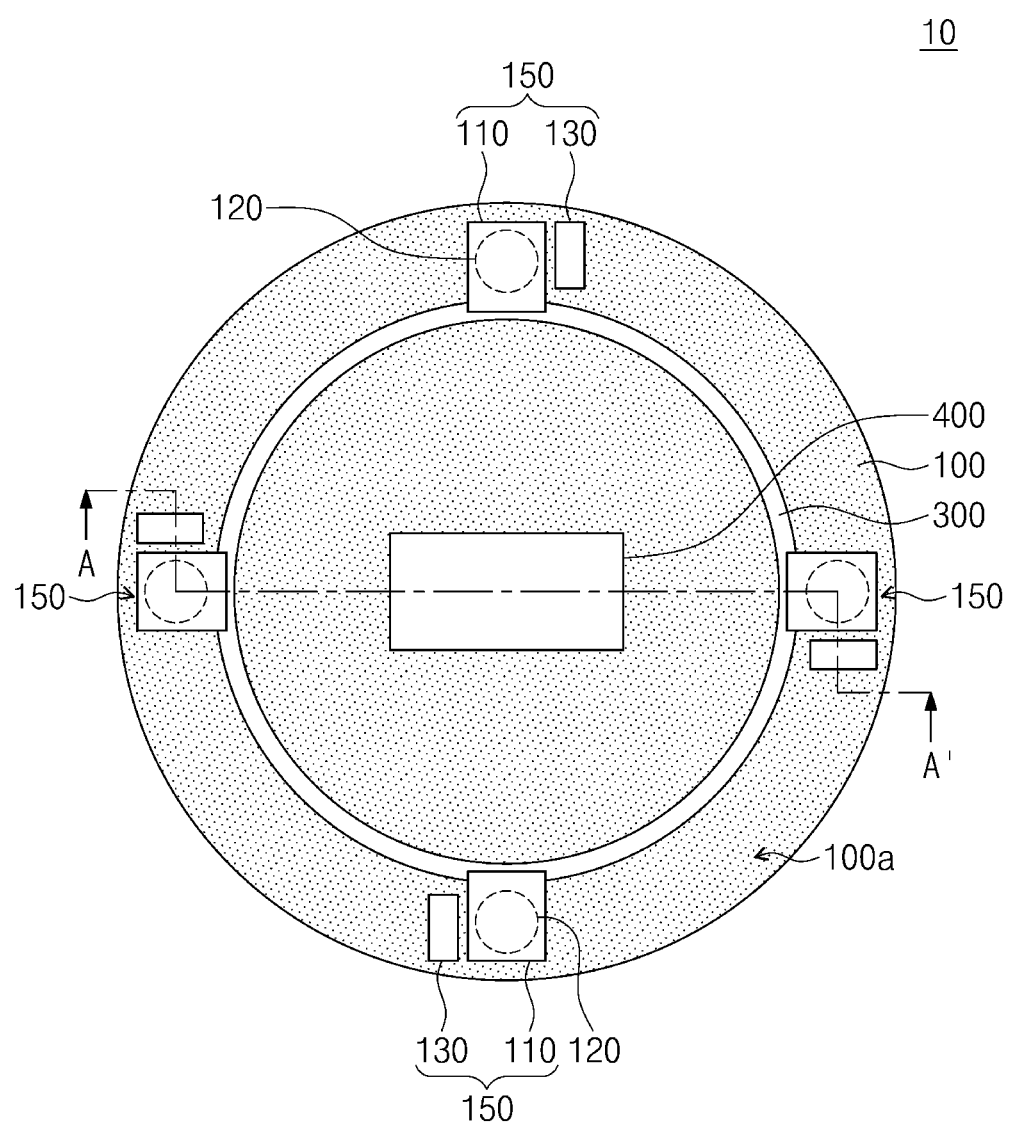
FIG. 8 is a front view of a vision sensor according to example embodiments of the inventive concept.
Figure 9:
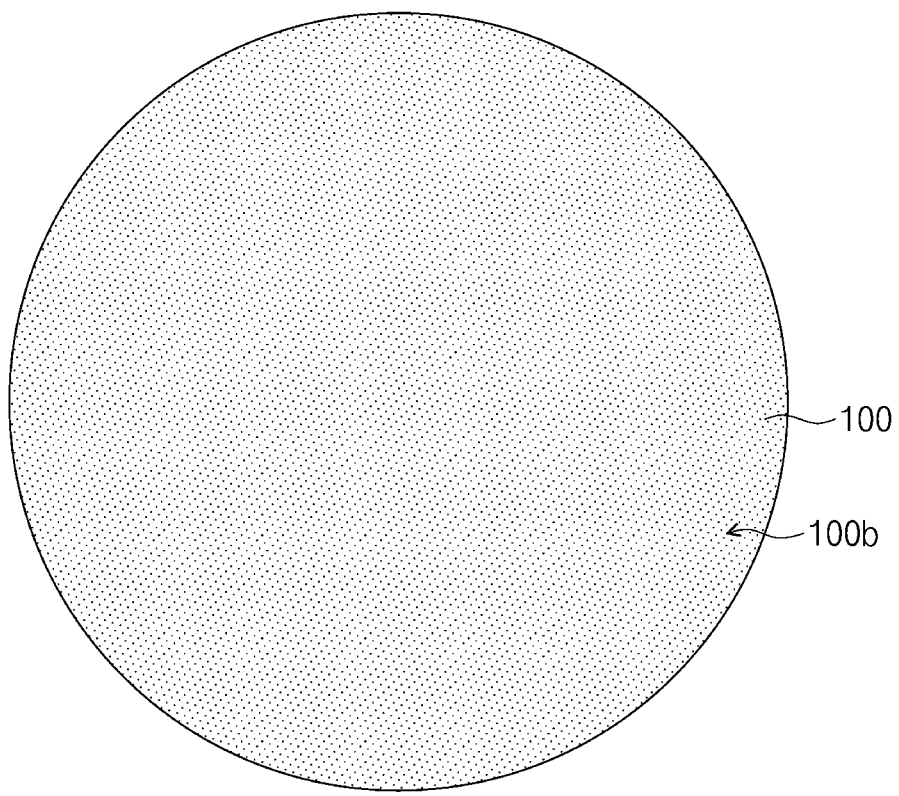
FIG. 9 is a rear view of a vision sensor according to example embodiments of the inventive concept.
Figure 10:
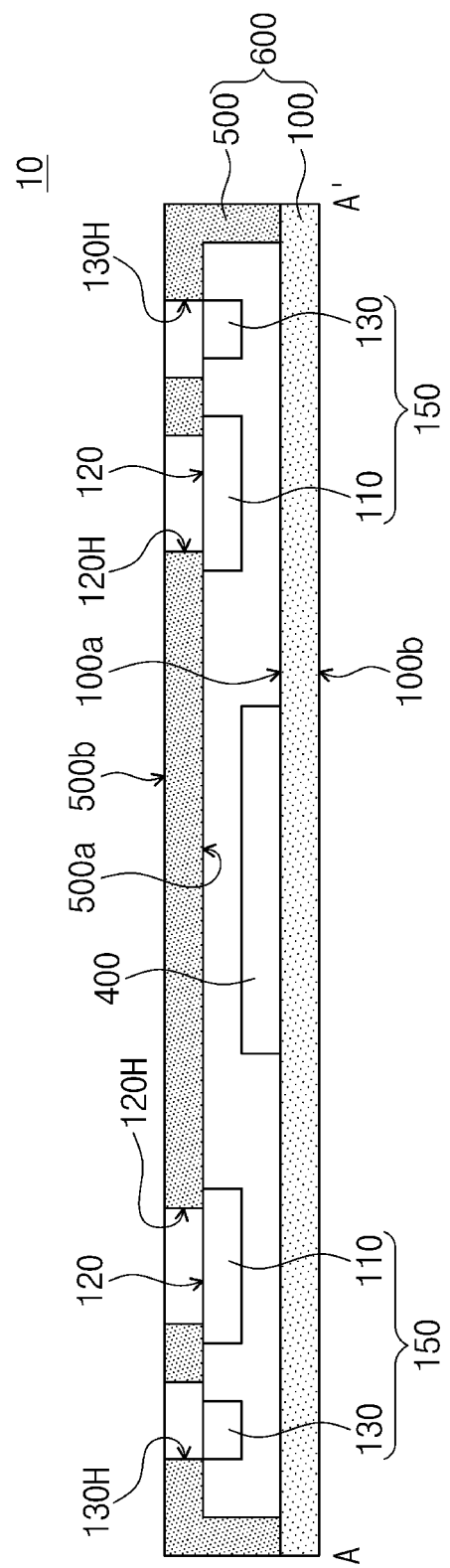
FIG. 10 is a cross-sectional view taken along line A-A' of FIG. 8.

FIG. 8 is a front view of a vision sensor according to example embodiments of the inventive concept. FIG. 9 is a rear view of a vision sensor according to example embodiments of the inventive concept. FIG. 10 is a cross-sectional view taken along line A-A' of FIG. 8. In FIG. 8, the cover member 500 shown in FIG. 10 is omitted. For convenience of explanation, differences between a vision sensor of the present embodiment and the vision sensor 10 described with reference to FIGS. 1 to 7 will be mainly described.

Referring to FIGS. 8 to 10, the circuit member 400 may be disposed on the first surface 100a of the support member 100. The cover member 500 may be disposed on the first surface 100a of the support member 100 to cover the circuit member 400. The cover member 500 may have a third surface 500a facing the first surface 100a of the support member 100 and a fourth surface 500b opposite to the third surface 500a. In some embodiments, the cover member 500 may include a plurality of holes 120H and 130H passing therethrough. Each of the plurality of holes 120H and 130H may extend from the third surface 500a to the fourth surface 500b.

In some embodiments, the image scanning module 150 may be disposed on the third surface 500a of the cover member 500. In this case, the illuminator 130 of the image scanning module 150 may be disposed on the third surface 500a of the cover member 500 to be overlapped with the corresponding hole 130H among the plurality of holes 120H and 130H. The camera 110 of the image scanning module 150 may be disposed on the third surface 500a of the cover member 500 so that the lens 120 of the camera 110 is overlapped with the corresponding hole 120H among the plurality of holes 120H and 130H. In some embodiments, the sensor 10 may be provided so that the fourth surface 500b of the cover member 500 faces the target. The illuminator 130 may be configured to project the pattern (e.g., the fringe pattern) onto the target through the corresponding hole 130H. The camera 110 may be configured to scan an image of the target through the corresponding hole 120H.

In some embodiments, a plurality of image scanning modules 150 may be provided. In this case, the plurality of image scanning modules 150 may be disposed on the third surface 500a of the cover member 500 to be spaced apart from each other. For example, the plurality of image scanning modules 150 may be arranged to be spaced apart from each other along an edge of the cover member 500. The fixing member 300 may be disposed on the third surface 500a of the cover member 500. The plurality of the image scanning modules 150 may be coupled with the fixing member 300. The plurality of image scanning modules 150 may be fixed on the third surface 500a of the cover member 500 by the fixing member 300, but the inventive concept is not limited thereto. In some embodiments, the fixing member 300 may be omitted. The support member 100 and the cover member 500 may constitute the housing 600. The image scanning module 150, the fixing member 300, and the circuit member 400 may be provided in the housing 600.

Figure 11:
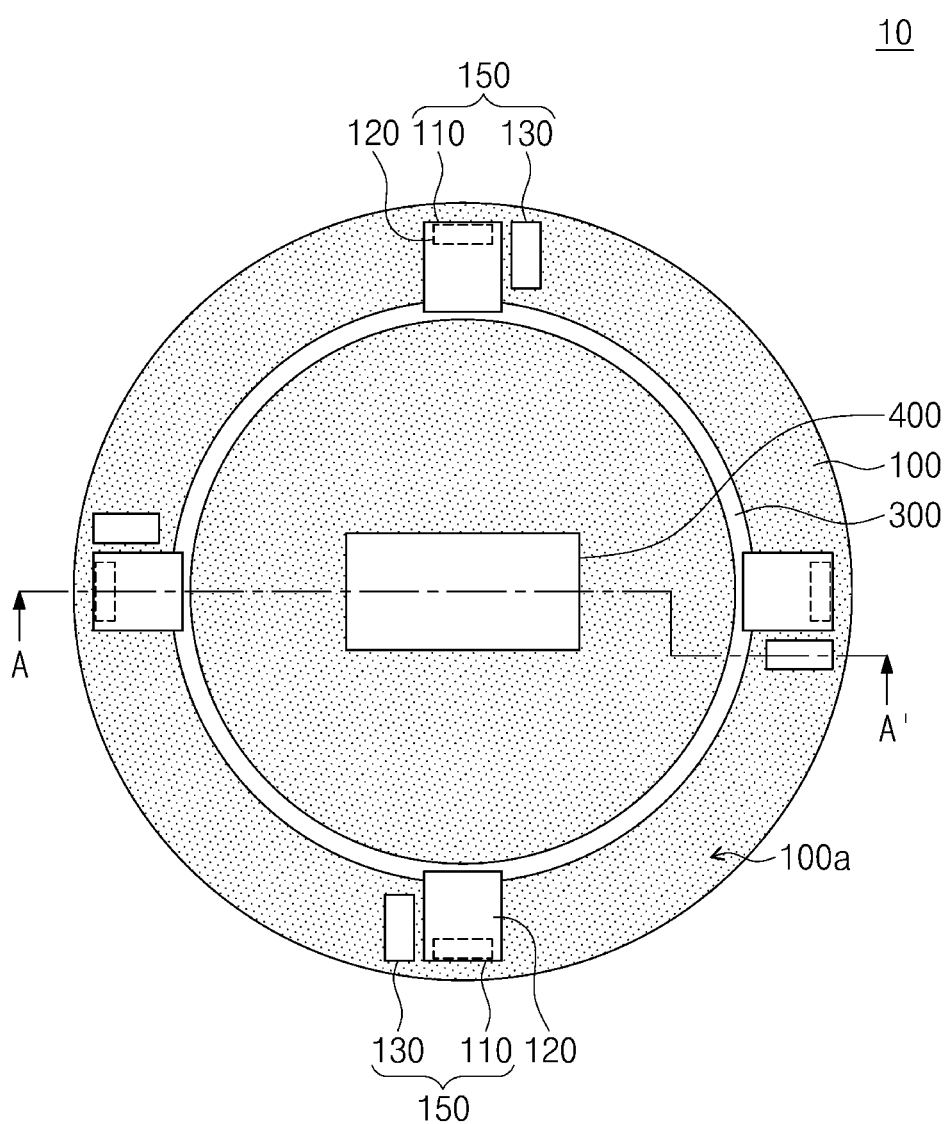
FIG. 11 is a front view of a vision sensor according to example embodiments of the inventive concept.
Figure 12:
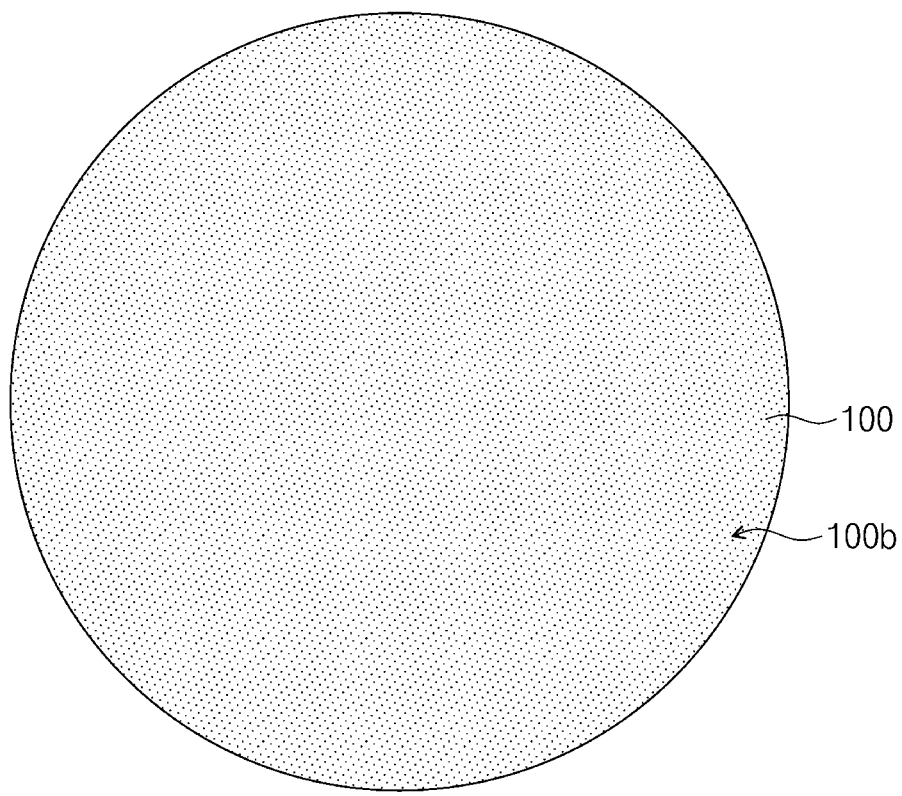
FIG. 12 is a rear view of a vision sensor according to example embodiments of the inventive concept.
Figure 13:
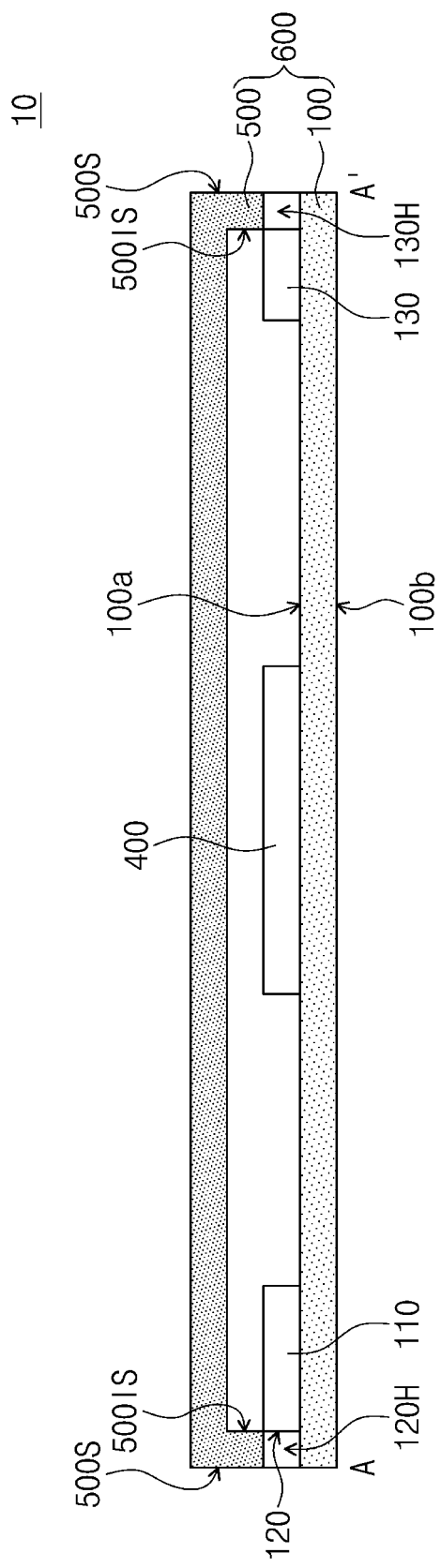
FIG. 13 is a cross-sectional view taken along line A-A' of FIG. 11.

FIG. 11 is a front view of a vision sensor according to example embodiments of the inventive concept. FIG. 12 is a rear view of a vision sensor according to example embodiments of the inventive concept. FIG. 13 is a cross-sectional view taken along line A-A' of FIG. 11. In FIG. 11, the cover member 500 shown in FIG. 13 is omitted. For convenience of explanation, differences between a vision sensor of the present embodiment and the vision sensor 10 described with reference to FIGS. 1 to 7 will be mainly described.

Referring to FIGS. 11 to 13, the circuit member 400 may be disposed on the first surface 100a of the support member 100. The cover member 500 may be disposed on the first surface 100a of the support member 100 to cover the circuit member 400. In some embodiments, the cover member 500 may include a plurality of holes 120H and 130H passing therethrough. Each of the plurality of holes 120H and 130H may penetrate a sidewall of the cover member 500.

In some embodiments, the image scanning module 150 may be disposed on an inner sidewall 500IS of the cover member 500. In this case, the illuminator 130 of the image scanning module 150 may be disposed on the inner sidewall 500IS of the cover member 500 to be overlapped with the corresponding hole 130H among the plurality of holes 120H and 130H. The camera 110 of the image scanning module 150 may be disposed on the inner sidewall 500IS of the cover member 500 so that the lens 120 of the camera 110 is overlapped with the corresponding hole 120H among the plurality of holes 120H and 130H. In some embodiments, the sensor 10 may be provided so that an outer sidewall 500S of the cover member 500 may face the target. The illuminator 130 may be configured to project the pattern (e.g., the fringe pattern) onto the target through the corresponding hole 130H. The camera 110 may be configured to scan an image of the target through the corresponding hole 120H.

In some embodiments, a plurality of image scanning modules 150 may be provided. The plurality of image scanning modules 150 may be arranged to be spaced apart from each other along the inner sidewall 500IS of the cover member 500. The fixing member 300 may be disposed on the first surface 100a of the support member 100, and the plurality of image scanning modules 150 may be coupled with the fixing member 300. In some embodiments, the fixing member 300 may be omitted.

The support member 100 and the cover member 500 may constitute the housing 600. The image scanning module 150, the fixing member 300, and the circuit member 400 may be disposed in the housing 600.

Figure 14:
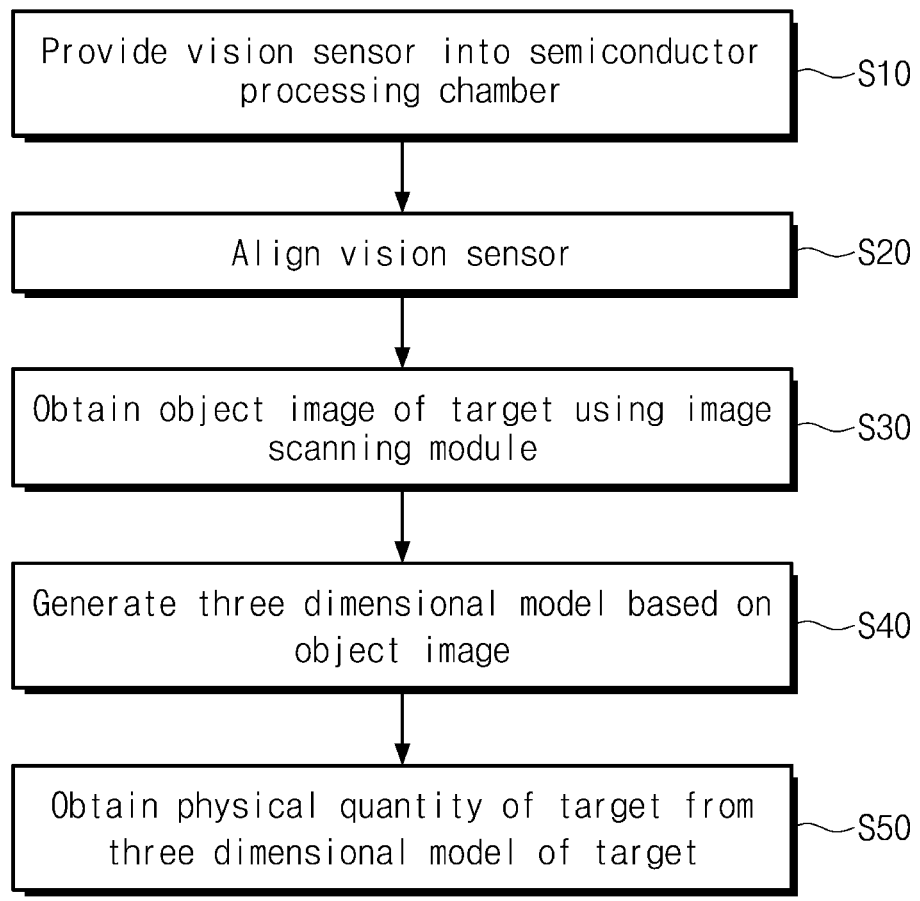
FIG. 14 is a flow chart illustrating a method of inspecting a semiconductor processing chamber using a vision sensor according to example embodiments of the inventive concept.
Figure 16A:
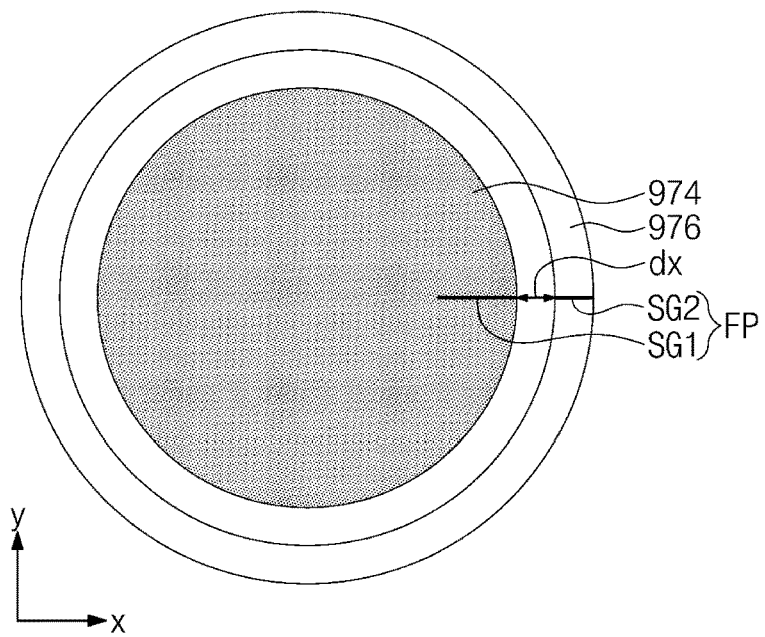
FIGS. 16A and 16B are conceptual views for exemplarily explaining operations S30, S40, and S50 of FIG. 14.
Figure 16B:
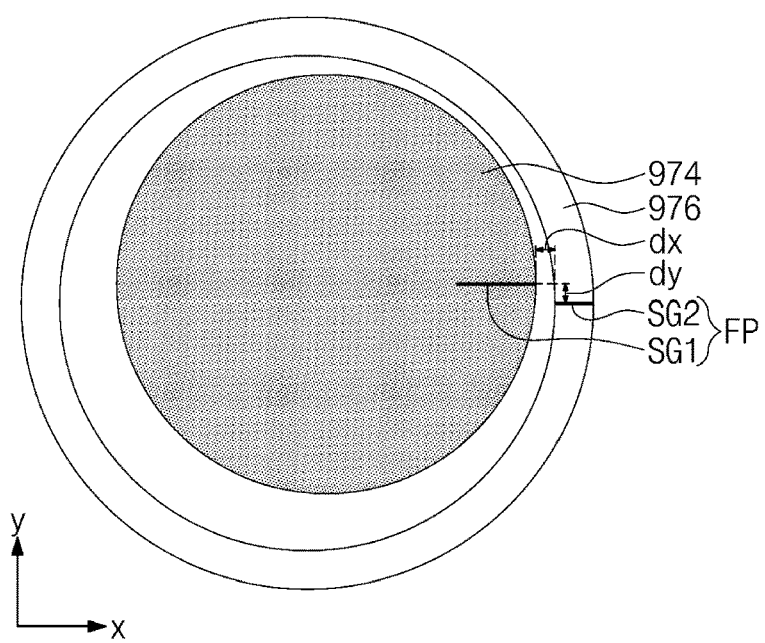

FIG. 14 is a flow chart illustrating a method of inspecting a semiconductor processing chamber using a vision sensor according to example embodiments of the inventive concept. FIG. 15 is a schematic view illustrating a semiconductor processing apparatus including a semiconductor processing chamber according to example embodiments of the inventive concept. FIGS. 16A and 16B are schematic views for exemplarily explaining operations S30, S40, and operation S50 of FIG. 14.

Referring to FIGS. 14 and 15, in operation S10, the vision sensor 10 may be provided into a semiconductor processing chamber 900 of a semiconductor processing apparatus 1000.

Specifically, the semiconductor processing apparatus 1000 may include the semiconductor processing chamber 900, a first buffer chamber 910 connected to the semiconductor processing chamber 900, a second buffer chamber 920 connected to the first buffer chamber 910, and a load port 930 connected to the second buffer chamber 920. The semiconductor processing chamber 900 may be configured to perform a unit process (e.g., an etching process) for manufacturing a semiconductor device therein. For example, the semiconductor processing chamber 900 may include an electrostatic chuck 970 disposed therein. The electrostatic chuck 970 may include a base body 972, a plate 974, and an edge ring 976. The base body 972 may serve as a lower electrode. The plate 974 may be disposed on the upper surface of the base body 972, and may include an electrode therein. The edge ring 976 may surround an outer circumferential surface of the plate 974. A semiconductor substrate (e.g., a wafer) used for manufacturing the semiconductor device may be seated on the plate 974 of the electrostatic chuck 970. The inside of the semiconductor processing chamber 900 may be in a vacuum and/or high temperature state to perform the unit process. The first buffer chamber 910 and the second buffer chamber 920 may include a first transfer means 950 and a second transfer means 960, respectively, that are configured to transfer the semiconductor substrate. The load port 930 may be exposed to the outside environment.

A storage container 940 in which the vision sensor (i.e., the sensor) 10 is loaded may be provide on the load port 930. The sensor 10 may have a proper form that may be transported by the first and second transfer means 950 and 960. In some embodiments, the sensor 10 may have a wafer shape having the same diameter as the semiconductor substrate, but the inventive concept is not limited thereto. The sensor 10 may be moved from the storage container 940 to the second buffer chamber 920 and from the second buffer chamber 920 to the first buffer chamber 910, by the second transfer means 960. The inside of the first buffer chamber 910 may be in a vacuum state. The sensor 10 may be provided from the first buffer chamber 910 into the semiconductor processing chamber 900 by the first transfer means 950. In this case, the semiconductor processing chamber 900 may be maintained in a vacuum and/or high temperature state. The sensor 10 may be disposed on, for example, the electrostatic chuck 970.

In operation S20, the sensor 10 may be aligned in the semiconductor processing chamber 900. The sensor 10 may be aligned using the image scanning module 150. For example, an image of the electrostatic chuck 970 may be obtained using the image scanning module 150, and the sensor 10 may be aligned on the target in the semiconductor processing chamber 900, based on the obtained image. The aligning of the sensor 10 may include adjusting a horizontal position or vertical position of the sensor 10 in the semiconductor processing chamber 900 and adjusting a slope of the sensor 10.

FIGS. 14, 16A, and 16B, in operation S30, the object image IMG of the target may be obtained using the image scanning module 150 of the sensor 10. For example, the target may include the plate 974 and the edge ring 976. The obtaining of the object image IMG may include projecting the pattern (e.g., the fringe pattern) onto the plate 974 and the edge ring 976 using the illuminator 130 of the image scanning module 150 and scanning an image of the plate 974 and the edge ring 976 in which the pattern FP is projected using the camera 110 of the image scanning module 150. In some embodiments, the pattern FP may be divided into the first segment SG1 projected onto the plate 974 and the second segment SG2 projected onto the edge ring 976. The object image IMG may include the fringe pattern FP divided into the first and second segments SG1 and SG2.

In operation S40, a three dimensional model of the target may be generated based on the object image IMG, and in operation S50, a physical quantity of the target may be obtained from the three dimensional model of the target. For example, the processor 410 of the sensor 10 may be configured to generate a three dimensional model of the plate 974 and the edge ring 976 by analyzing a shape of the pattern FP included in the object image IMG, and to obtain the physical quantity of the plate 974 and the edge ring 976 from the three dimensional model. For example, as shown in FIG. 16A, in the case in which the first and second segments SG1 and SG2 of the pattern FP are spaced apart from each other in an x direction, a distance dx in the x direction between the first and second segments SG1 and SG2 may be measured by the processor 410. Thus, a spacing distance between the plate 974 and the edge ring 976 may be obtained. In some embodiments, as shown in FIG. 16B, in the case in which the first and second segments SG1 and SG2 of the pattern FP are spaced apart from each other in the x direction and a y direction, a distance dx in the x direction and a distance dy in the y direction between the first and second segments SG1 and SG2 may be measured by the processor 410. Thus, information of a spacing distance and misalignment between the plate 974 and the edge ring 976 may be obtained.

Figure 17:
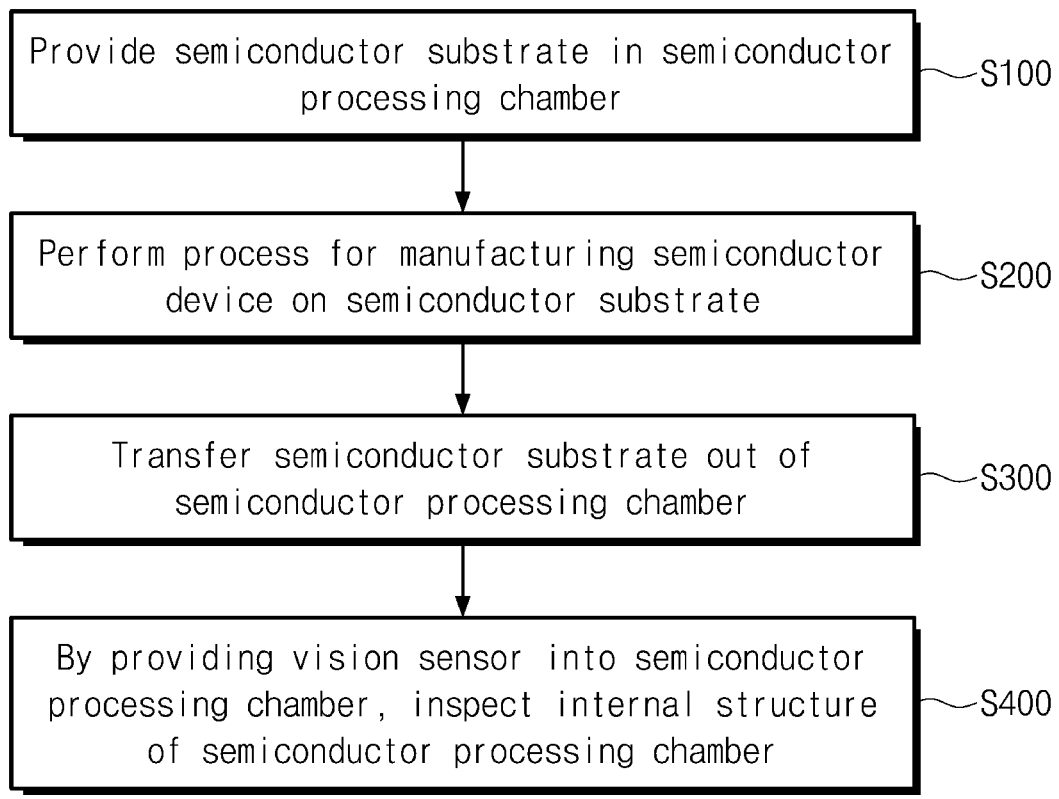
FIG. 17 is a flow chart illustrating a method of manufacturing a semiconductor device according to example embodiments of the inventive concept.

FIG. 17 is a flow chart illustrating a method of manufacturing a semiconductor device according to example embodiments of the inventive concept.

Referring to FIGS. 15 and 17, in operation S100, a semiconductor substrate may be provided in the semiconductor processing chamber 900 of the semiconductor processing apparatus 1000. For example, the semiconductor substrate may be loaded along with the vision sensor (i.e., the sensor) 10 in the storage container 940. The semiconductor substrate may be transferred from the storage container 940 to the second buffer chamber 920 and from the second buffer chamber 920 to the first buffer chamber 910 by the second transfer means 960. The semiconductor substrate may be provided from the first buffer chamber 910 into the semiconductor processing chamber 900 by the first transfer means 950, and may be seated on the plate 974 of the electrostatic chuck 970.

In operation S200, a process for manufacturing the semiconductor device may be performed on the semiconductor substrate in the semiconductor processing chamber 900. To perform the process, the inside of the semiconductor processing chamber 900 may be in a vacuum or high temperature state. In operation S300, after the process is performed, the semiconductor substrate may be transferred out of the semiconductor processing chamber. For example, the semiconductor substrate may be transferred from the semiconductor processing chamber 900 to the first buffer chamber 910 by the first transfer means 950, and may be transferred from the first buffer chamber 910 to the second buffer chamber 920 and from the second buffer chamber 920 to the storage container 940 by the second transfer means 960. Thereafter, in operation S400, an internal structure of the semiconductor processing chamber 900 may be inspected by providing the sensor 10 into the semiconductor processing chamber 900. The inspecting of the semiconductor processing chamber 900 may be performed in substantially the same manner as the method of inspecting the semiconductor processing chamber described with reference to FIG. 14. While the inner structure of the semiconductor processing chamber 900 is inspected using the sensor 10, the semiconductor processing chamber 900 may be maintained in a vacuum or high temperature state.

According to example embodiments of the inventive concept, the vision sensor 10 may include the image scanning module 150, and the image scanning module 150 may include the illuminator 130 configured to project the pattern (e.g., the fringe pattern) onto the target and the camera 110 configured to scan the image of the target in which the pattern is projected. The sensor 10 may further include the processor 410. The processor 410 may be configured to generate the three dimensional model of the target based on the object image of the target obtained by the image scanning module 150 and to obtain the physical quantity of the target from the three dimensional model of the target. Thus, the internal structure (e.g., abrasion extent of the parts, misalignment between the parts, etc.) of the semiconductor processing chamber 900 may be precisely inspected. Furthermore, the sensor 10 may be provided in the semiconductor processing chamber 900 in the vacuum and/or high temperature state. The inspection of the internal structure of the semiconductor processing chamber 900 may be easily performed.

While the present inventive concept has been particularly shown and described with reference to example embodiments thereof, it will be understood by those of ordinary skill in the art that various changes in form and details may be made therein without departing from the spirit and scope of the present disclosure as defined by the following claims.

What is claimed is:

1. A method of inspecting a semiconductor processing chamber, the method comprising:
providing a vision sensor into the semiconductor processing chamber;
aligning the vision sensor on a target in the semiconductor processing chamber;
obtaining an object image of the target using an image scanning module of the vision sensor;
generating a three dimensional model of the target based on the object image; and
obtaining a physical quantity of the target from the three dimensional model,
wherein the obtaining of the object image of the target includes:
projecting a pattern onto the target using an illuminator of the image scanning module; and
scanning an image of the target in which the pattern is projected, using a camera of the image scanning module,
wherein the generating of the three dimensional model is based on a distance between a first segment of the pattern captured from the target by the camera and a second segment of the pattern captured from the target by the camera,
wherein a height component for the three dimensional model is based on the following equation: $h=d/(\tan \theta)$,
where d is the distance between the first segment of the pattern and the second segment of the pattern, and $\theta$ is an angle at which a laser light projects the pattern onto a surface of the target.

2. The method of claim 1, wherein the projecting the pattern onto the target is performed by a laser light included in the illuminator.

3. The method of claim 2, further comprising controlling an optical path of the laser light using an optical member in the illuminator, such that the laser light is irradiated obliquely with respect to an upper surface of the target.

4. The method of claim 1, wherein the providing the vision sensor into the semiconductor processing chamber is performed while an inside of the semiconductor processing chamber is in a vacuum state.

5. The method of claim 1, wherein the illuminator includes a laser light source and an optical member,
the optical member is configured to control an optical path of a laser light emitted from the laser light source, and
the pattern is projected onto the target by the laser light.

6. The method of claim 5, wherein the laser light is irradiated obliquely with respect to an upper surface of the target.

7. The method of claim 5, wherein the vision sensor includes a support member,
wherein the support member has opposite first and second surfaces, the image scanning module is disposed on the first surface of the support member, and
the laser light source is disposed on the first surface of the support member and has a lengthwise axis parallel to the first surface of the support member.

8. The method of claim 7, wherein the support member includes a plurality of holes extending from the first surface of the support member to the second surface of the support member,
the optical member is disposed on the first surface of the support member, and
the laser light is irradiated on the target through a corresponding hole among the plurality of holes.

9. The method of claim 8, wherein the vision sensor includes a circuit member disposed on the first surface of the support member, and including a processor and a wireless communication module,
wherein the processor is configured to receive the object image from the image scanning module and generate data based on the object image, and
the wireless communication module is configured to transmit the data to an external device.

10. The method of claim 9, wherein the circuit member includes a battery module configured to supply power to the vision sensor.

11. The method of claim 9, wherein the vision sensor includes a cover member disposed on the first surface of the support member, and covering the illuminator and the circuit member,
wherein the support member and the cover member constitute a housing, and
the illuminator and the circuit member are disposed in the housing.

12. The method of claim 11, wherein the housing has a wafer shape.

13. The method of claim 7, wherein the support member has a wafer shape.

14. The method of claim 1, wherein the vision sensor includes a support member and a cover member disposed on the support member,
wherein the support member and the cover member constitute a housing, and
the image scanning module is disposed in the housing.

15. The method of claim 14, wherein at least one of the support member and the cover member includes a plurality of holes passing through the at least one of the support member and the cover member, and
the illuminator is configured to project the pattern onto the target through a corresponding hole among the plurality of holes.

16. The method of claim 15, wherein the housing has a wafer shape.

17. A method for manufacturing a semiconductor device, the method comprising:
providing a semiconductor substrate in a semiconductor processing chamber;
performing a process for manufacturing the semiconductor device on the semiconductor substrate in the semiconductor processing chamber;
transferring the semiconductor substrate out of the semiconductor processing chamber; and
inspecting an internal structure of the semiconductor processing chamber by providing a vision sensor into the semiconductor processing chamber,
wherein the inspecting of the internal structure of the semiconductor processing chamber includes:
obtaining an object image of a target using an image scanning module of the vision sensor; and
generating a three dimensional model of the target based on the object image; and wherein the obtaining of the object image of the target includes:
projecting a pattern onto the target using an illuminator of the image scanning module; and
scanning an image of the target in which the pattern is projected, using a camera of the image scanning module,
wherein the generating of the three dimensional model is based on a distance between a first segment of the pattern captured from the target by the camera and a second segment of the pattern captured from the target by the camera,
wherein a height component for the three dimensional model is based on the following equation: $h=d/(\tan\theta)$,
where d is the distance between the first segment of the pattern and the second segment of the pattern, and $\theta$ is an angle at which a laser light projects the pattern onto a surface of the target.

18. The method of claim 17, wherein the illuminator includes a laser light source and an optical member,
the optical member is configured to control an optical path of a laser light emitted from the laser light source, and
the pattern is projected onto the target by the laser light.

19. The method of claim 18, wherein the optical member is configured to control the optical path of the laser light such that the laser light is irradiated obliquely with respect to an upper surface of the target.

20. The method of claim 17, wherein the providing the vision sensor into the semiconductor processing chamber is performed while an inside of the semiconductor processing chamber is in a vacuum state.

21. The method of claim 1, wherein the pattern projected onto the target is a linear fringe pattern.

22. The method of claim 1, wherein the first segment of the pattern and the second segment of the pattern are generated by the same linear fringe pattern projected onto the target by the laser light.

* * * * *